(12) United States Patent
Hariton (10) Patent No.: US 6,351,137 B1
(45) Date of Patent: Feb. 26, 2002

(54) IMPEDANCE EMULATOR

(75) Inventor: Dan Ion Hariton, San Jose, CA (US)

(73) Assignee: Pulsecore, Inc., San Jose, CA (US)

( * ) Notice: Subject to any disclaimer, the term of this patent is extended or adjusted under 35 U.S.C. 154(b) by 0 days.

(21) Appl. No.: 09/637,350

(22) Filed: Aug. 15, 2000

(51) Int. Cl.$^7$ .......................... H03K 17/16; G05F 3/02; H03F 1/34

(52) U.S. Cl. .......................... 326/30; 326/21; 326/86; 327/540; 327/541; 330/85; 330/103

(58) Field of Search .............................. 326/30–32, 21, 326/34, 86; 333/22 R, 32; 327/538, 540, 541, 543, 63, 67, 68, 73

(56) References Cited

U.S. PATENT DOCUMENTS

| | | | | |
|---|---|---|---|---|
| 5,585,741 A | * | 12/1996 | Jordan | 326/30 |
| 5,706,240 A | * | 1/1998 | Fiocchi et al. | 365/226 |
| 5,856,758 A | * | 1/1999 | Joffe et al. | 330/85 |
| 5,886,570 A | * | 3/1999 | Brokaw | 327/540 |
| 6,037,832 A | * | 3/2000 | Kaminishi | 327/538 |
| 6,133,779 A | * | 10/2000 | Sichert et al. | 327/540 |
| 6,181,195 B1 | * | 1/2001 | McIntyre | 327/538 |

OTHER PUBLICATIONS

Mark N. Horenstein, Microelectronic Circuits & Devices, 2nd edition, 1996, p. 48–51.*

* cited by examiner

Primary Examiner—Michael Tokar
Assistant Examiner—Vibol Tan
(74) Attorney, Agent, or Firm—Harris Zimmerman, Esq.

(57) ABSTRACT

A method and device to emulate impedances includes a pair of impedances connected in series between a supply voltage and ground, the impedances forming a voltage divider having at its midpoint a reference voltage $V_x$. An OP AMP includes a positive input connected to the $V_x$ node and the negative input connected to the output thereof in a direct feedback loop. The OP AMP output is also connected to a load impedance that is connected either to the supply voltage or ground. The unity gain OP AMP forces the output voltage thereof to follow the input voltage $V_x$, whereby the output voltage behaves as if it were created by a virtual impedance. By proper choice of components and values, the virtual impedance may comprise a large capacitor, and the remaining impedances may comprise resistance and small capacitance, both of which, together with the OP AMP, are easily integrated in a small die area. A transistor may be interposed between the load impedance and supply or ground to eliminate unacceptably large current flow through the OP AMP. The OP AMP may be provided with a negative gain, and the impedances may be scaled to create a virtual inductor having a predetermined value. Impedance emulator circuits may be combined so that the emulated impedance of one circuit may act as a virtual component in a further emulation circuit, whereby a wide range of component impedances values of may be replicated.

25 Claims, 6 Drawing Sheets

IMPEDANCE EMULATOR

BACKGROUND OF THE INVENTION

The present invention relates to integrated circuits, and, specifically, to impedance emulations that provide functions heretofore unavailable in integrated circuits.

The design and fabrication of integrated circuits has evolved to the point where virtually any digital or analog circuit may be created in silicon or other semiconductor material, and may be replicated in large numbers. Some aspects of circuit design have not been available to IC designers, due primarily to limitations imposed by physics and economics. For example, in some circuit designs there is a need for a relatively large capacitor, which may be fabricated in an IC only by forming parallel conductors in adjacent layers. If the required capacitor is large, the parallel conductors may occupy a significant portion of the total die area, thereby limiting the area available for the remaining components of the circuit. Since die size is linked to device cost, there is a strong economic incentive to avoid circuits that require a large capacitor.

Likewise, in IC circuit designs impedance is formed by various combinations of capacitance and resistance, due to the fact that there is no IC component that provides an inductive impedance. The multi-turn coil, well-known in classic electronics to create inductance, has no counterpart in the IC armamentarium. Although most circuits can be designed using capacitive reactance, the lack of integrated circuit inductance does comprise a design limit in IC layouts.

Assuming, arguendo, that it is generally not practical to incorporate large capacitors in an IC, and it is virtually impossible to incorporate inductors in an IC, there exists a need in the prior art for some way to replicate or emulate inductors and large capacitors, using the circuit components that are readily available in IC design.

SUMMARY OF THE INVENTION

The present invention generally comprises a method and device to replace circuit components that are difficult to form in integrated circuits, or that are too large in area to be economical, by providing component emulators that are simple to form with available IC components. The invention provides functionality, such as inductive impedance or large capacitance, that has been heretofore unattainable in integrated circuits. Furthermore, the invention may provide significant reductions in the die size of integrated circuits. Values of components that are difficult or impossible to integrate can thus be put in silicon.

The method of the invention employs a pair of impedances connected in series between a supply voltage and ground, the impedances forming a voltage divider having at its midpoint a reference voltage $V_x$. An equivalent impedance pair network is connected between the supply voltage and ground, and the two networks are connected in an H configuration, with the cross-link joining nodes that are both at $V_{x\_}$. The impedances are scaled, so that the first pair have values of $KZ_a$ and $KZ_b$, and the second pair of impedances have values of $KZ_a/(K-1)$ and $KZ_b/(K-1)$.

Any one of the impedance may be replaced by an operational amplifier (OP AMP) having unity gain, in which the output of the OP AMP is connected to the remaining impedance of the modified leg, and the positive input of the OP AMP is connected to the $V_{x\_}$ node of the unmodified leg. The negative input of the OP AMP is connected to the output thereof in a direct feedback loop. The unity gain OP AMP forces the output voltage thereof to follow the input voltage $V_x$, as if the impedance had not been removed. By proper choice of components and values, the impedance that is replaced may comprise a large capacitor, and the remaining impedances may comprise resistance and small capacitance, both of which, together with the OP AMP, are easily integrated in a small die area. Thus the output $V_x$ of the OP AMP may be made to emulate the behavior of a large capacitor, in effect forming a virtual capacitor. And the components used in the circuit occupy a die area far smaller than the capacitor that has been replaced.

In another aspect, the impedance emulator described above may be modified by the addition of a transistor having a source/drain circuit connected in place of the eliminated impedance of the H network, with the OP AMP output connected to the transistor gate. The negative input of the OP AMP is connected to the junction of the transistor source/drain circuit and the remaining impedance. This arrangement relieves the OP AMP from acting as a source or drain for the remaining impedance, thereby eliminating unacceptably large current flow through the OP AMP.

In a further aspect, the invention may be configured to emulate an inductive impedance. Using the general circuit arrangement described above, the OP AMP may be provided with a negative gain, and the impedances may be scaled to create a virtual inductor having a predetermined value.

Impedance emulator circuits disclosed herein may be combined so that the emulated impedance of one circuit may act as a virtual component in a further emulation circuit, whereby a wide range of component impedances values of may be replicated. For example, an inductor emulator circuit may employ a large capacitance to achieve a large inductance value. The large capacitance, which is impractical in an integrated circuit, may be comprised by a capacitor emulator circuit connected appropriately in the inductor emulator circuit. Other such combinations of emulator circuits may be made to create a wide range of capacitor and inductor values.

BRIEF DESCRIPTION OF THE DRAWING

FIG. 5b is a schematic view of a voltage divider formed as an H network that is equivalent to the network of FIG. 5a.

FIG. 8b is a schematic view of an impedance network equivalent to the emulator circuit of FIG. 8a.

DESCRIPTION OF THE PREFERRED EMBODIMENT

Figures 1, 2:
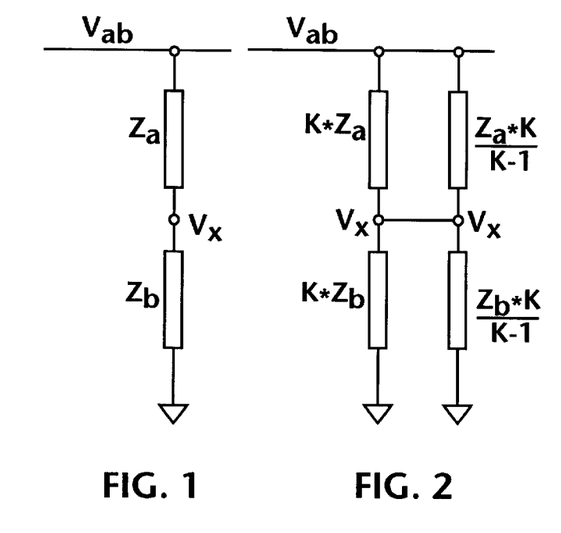
FIG. 1 is a schematic view of a voltage divider formed by two impedances connected between a voltage source and ground.
FIG. 2 is a schematic view of a voltage divider formed as an H network that is equivalent to the network of FIG. 1.
Figure 3:
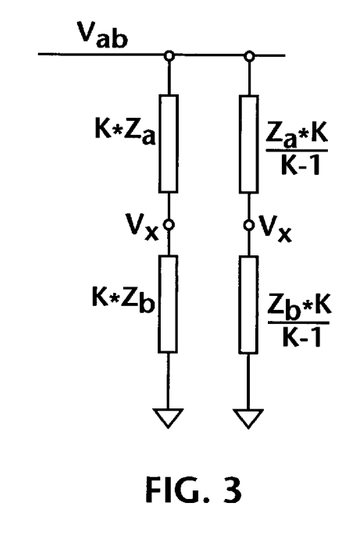
FIG. 3 is a schematic view of a voltage divider network as in FIG. 2, modified by the removal of the cross-link of the network.

The present invention generally comprises a method and device to replace circuit components that are difficult to form in integrated circuits, or that are too large in area to be economical, by providing component emulators that are simple to form with available IC components. With regard to FIG. 1, two impedances, $Z_a$ and $Z_b$, are connected in series between a supply voltage $V_{ab}$ and ground, forming a voltage divider having at its midpoint a voltage $V_x$. As shown in FIG. 2, an equivalent voltage divider network may be formed as an H configuration. In this arrangement, a pair of impedances $KZ_a$ and $KZ_b$ are connected between the supply voltage and ground, and another pair of impedances $KZ_a/K-1$ and $KZ_b/K-1$ are connected between the supply voltage and ground. The midpoints of the paired impedances, which each produce a voltage $V_x$, may be connected together in a virtual short circuit. In FIG. 3, the wire shorting the two $V_x$ nodes is removed. Due to linear scaling, the left hand impedance divider (impedances scaled by a factor of K) generates a voltage $V_x$ equal to the $V_x$ voltage generated by the right hand impedance divider (impedances scaled by a factor of K/(K−1)). These two $V_x$ voltages are a virtual short; that is, their behavior in time is such that they track each other, as if a DC and AC short-circuit exists between these two points.

Figure 4A:
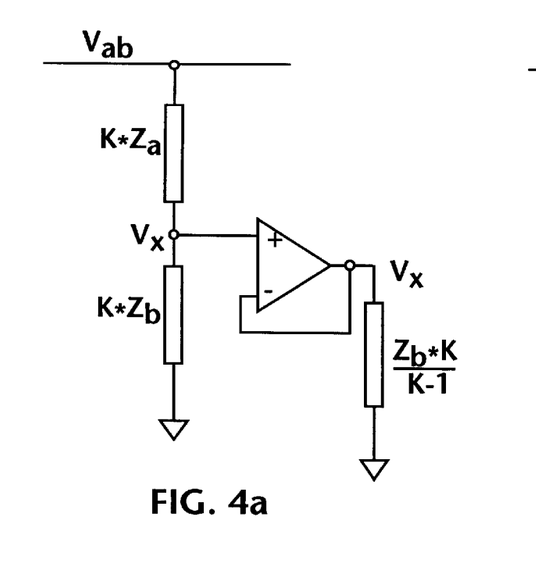
FIG. 4a is a schematic view of an impedance emulator circuit, similar to the networks of FIGS. 3 and 4, in which an OP AMP is substituted for one of the impedances.

With regard to FIG. 4a the top-right impedance (Za*K/(K−1) of FIG. 3) is removed. A unity gain OP AMP is substituted, with the output of the OP AMP connected to the remaining impedance of the modified leg, and the positive input of the OP AMP connected to the $V_x$ node of the unmodified leg. The negative input of the OP AMP is connected to the output thereof in a direct feedback loop. The ground return current is the same as the one in FIG. 3. The unity-gain amplifier forces the $V_x$ voltage from the left side to the right side, and sources current into the Zb*K/(K−1) output impedance. Thus it is significant to note that the right hand node at $V_x$ behaves exactly the same as the right hand node of FIG. 3, even though the upper right hand impedance Za*K/(K−1) has been eliminated.

Figure 4B:
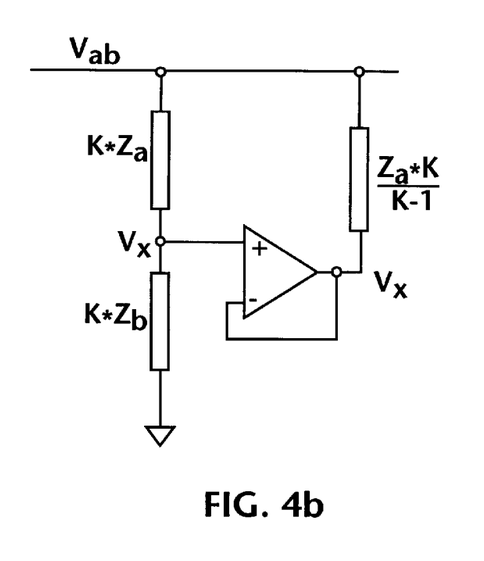
FIG. 4b is a schematic view of an impedance emulator circuit as in FIG. 4a, in which an OP AMP is substituted for another impedance.

With regard to FIG. 4b, the bottom-right impedance (Zb*K/(K−1), see FIG. 3) is removed, and replaced by an OP AMP connected as shown in FIG. 4a. The current drawn from the $V_{ab}$ line is the same as in FIG. 3. The amplifier output sinks current from the Za*K/(K−1) impedance. The impedance seen from the $V_{ab}$ line to ground is the same as the impedance seen from $V_{ab}$-to-ground in FIG. 1, in FIG. 2, and in FIG. 3. Note that $V_{ab}$ is just a node voltage that can have any value. $V_{ab}$ may also be the output of a current source. This impedance elimination neither assumes nor restricts $V_{ab}$ to be only a voltage source driven output; i.e. the impedance driving the $V_{ab}$ line can have any value, low or high.

Figure 4C:
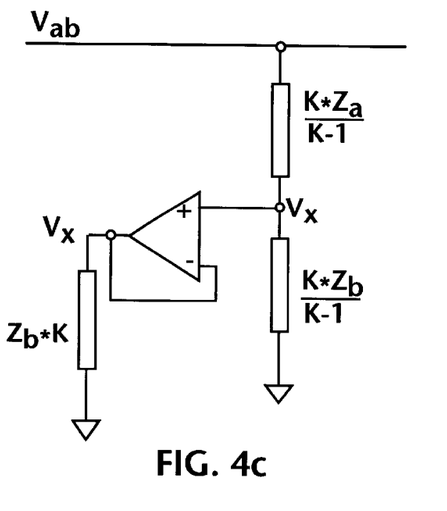
FIG. 4c is a schematic view of an impedance emulator circuit as in FIGS. 4a and 4b, in which an OP AMP is substituted for a further impedance.
Figure 4D:
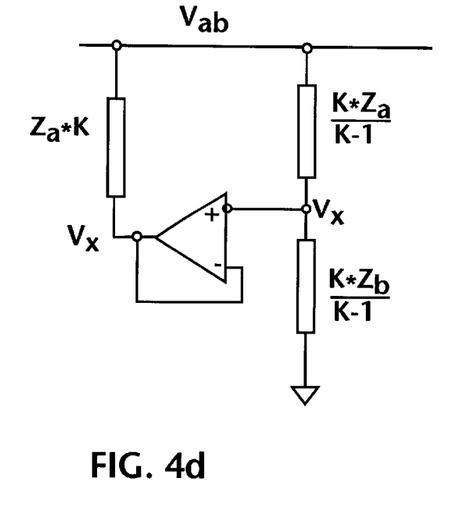
FIG. 4d is a schematic view of an impedance emulator circuit as in FIG. 4a–4d, in which an OP AMP is substituted for another impedance.

With regard to FIG. 4c, the top-left impedance (Za*K, see FIG. 3) is removed and replaced by a unity gain OP AMP connected as described previously. The ground return current is the same as in FIG. 3. The unity-gain amplifier forces the $V_x$ voltage from the right side to the left side. The amplifier sources current into the Zb*K output impedance. In this example, the left hand node at $V_x$ behaves exactly the same as the left hand node of FIG. 3, even though the upper left impedance Za*K has been eliminated. Likewise, in FIG. 4d the bottom-left impedance (Zb*K, see FIG. 3) is removed and replaced by an OP AMP connected as described previously. The current drawn from the $V_{ab}$ line is the same as the one in FIG. 3. The amplifier output sinks current from the Za*K impedance. Here again, the impedance seen from the $V_{ab}$ line to ground is the same as the impedance seen from $V_{ab}$-to-ground in FIG. 1, in FIG. 2, FIG. 3, and in FIG. 4b.

Figure 5A:
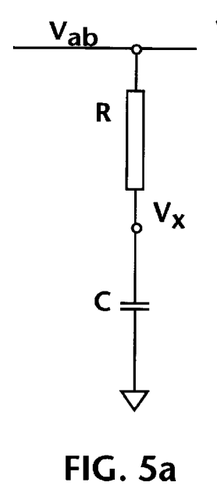
FIG. 5a is a schematic view of a voltage divider formed by two impedances, one being a capacitor.
Figure 5B:
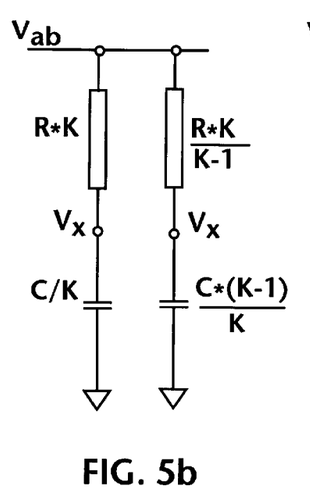
Figure 5C:
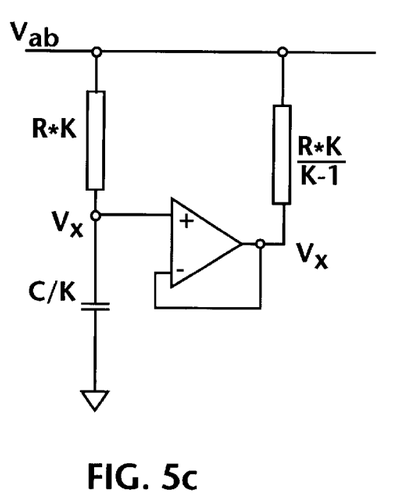
FIG. 5c is a schematic view of an impedance emulator circuit, similar to the networks of FIGS. 5a–5b, in which an OP AMP is substituted for one of the impedances.
Figures 6A, 6B:
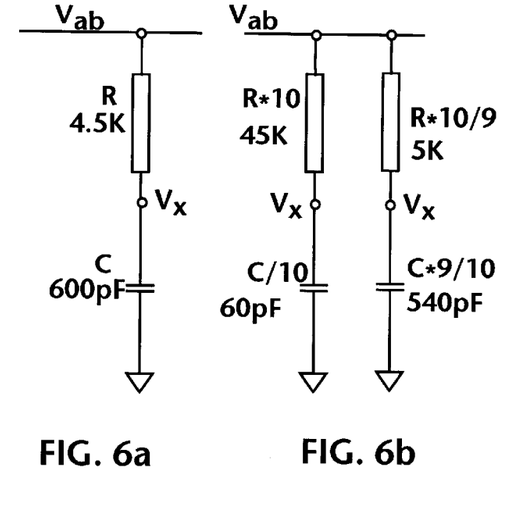
FIGS. 6a–6c are schematic views of circuits corresponding to FIGS. 5a–5c with real component values.
Figure 6C:
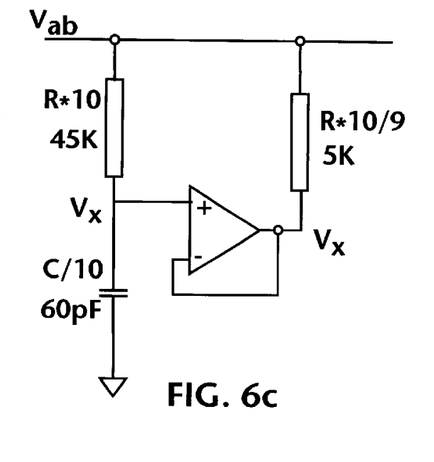

It is important to note that the impedances described in FIGS. 1–4 may comprise resistance, capacitance, and/or inductance, and any combination thereof. Thus, for example, the circuit of FIG. 5a, which corresponds to the simple series voltage divider of FIG. 1, consists of resistor R and capacitor C. The equivalent voltage divider, corresponding to FIG. 3, is shown in FIG. 5b, and the equivalent OP AMP circuit of FIG. 4a is shown in FIG. 5c. In FIG. 5c the capacitor component is reduced to C/K (K>>1) from the original component C in FIG. 5a. The equivalent C value stays the same in FIG. 5a–5c. Assuming for demonstration purposes that C=600 pF, R=4.5Kohms, and K=10, these values, []when substituted in the circuits of FIGS. 5a–5c, form the circuits shown in FIGS. 6a–6c, respectively. The impedance to ground from the $V_{ab}$ line remains the same in FIG. 5a–5c as in FIG. 6a–6c. Comparing the circuits of FIGS. 6b and 6c, it is significant to note that the 540 pF capacitor is eliminated, while the resulting circuit functions exactly as before. The silicon die size required by the 45KΩ resistor, 60 pF capacitor and the amplifier in FIG. 6c is much less than the area required by the 540 pF capacitor of FIG. 6b. Assuming that the circuit of FIG. 6a occupies 100% of a silicon die area, the circuit of FIG. 6c occupies about 20% of the die area, and approximately 80% of silicon die area is saved.

Figure 7A:
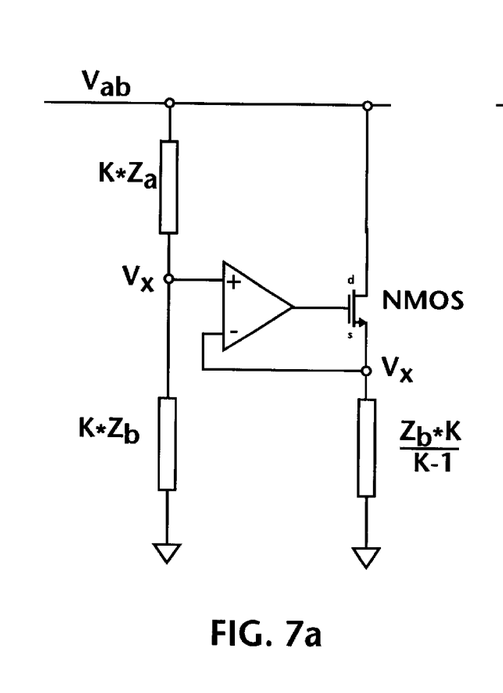
FIGS. 7a–7d are schematic views of circuits corresponding to FIGS. 4a–4d, with the addition of a transistor connected in place of the removed impedance in the network.
Figure 7B:
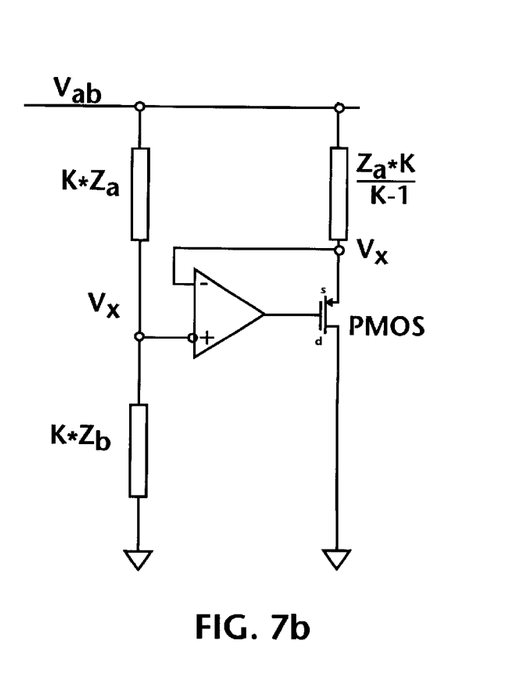
Figure 7C:
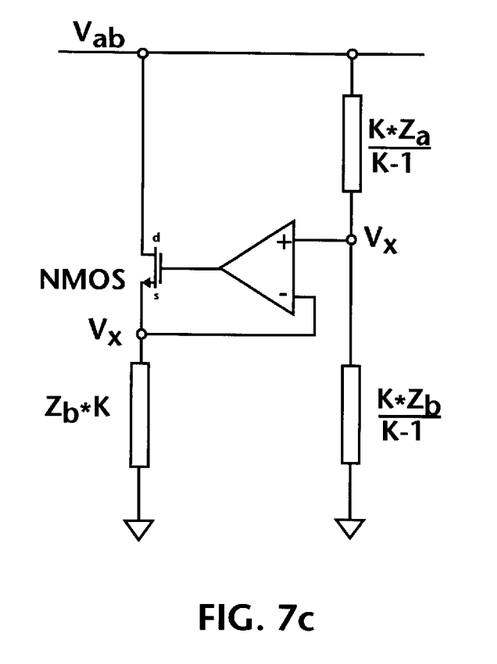
Figure 7D:
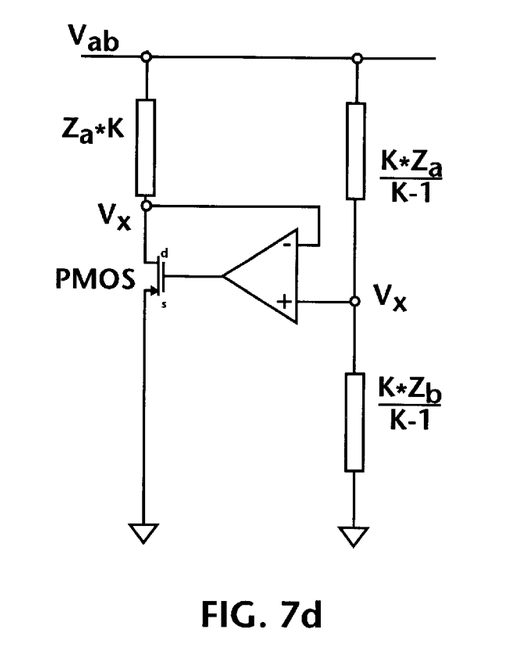

With regard to FIG. 7a, the circuit of FIG. 4a is augmented by the introduction of an NMOS transistor having a source/drain circuit connected in place of the eliminated impedance of the H network, with the OP AMP output connected to the transistor gate. The negative input of the OP AMP is connected to the junction of the transistor source/drain circuit and the remaining impedance. This arrangement relieves the OP AMP from acting as a source or drain for the remaining impedance, thereby eliminating unacceptably large current flow through the OP AMP. Likewise, the circuits of FIGS. 7b–7d correspond to the circuits of FIGS. 4b–4d with the addition of a similarly connected transistor. In each of them the impedance of the $V_{ab}$-to-ground path is equal to: Zab=Za+Zb, and the current sourced from $V_{ab}$ equals the current sunk into ground: Iab=$V_{ab}$/(Za+Zb).

Figure 8A:
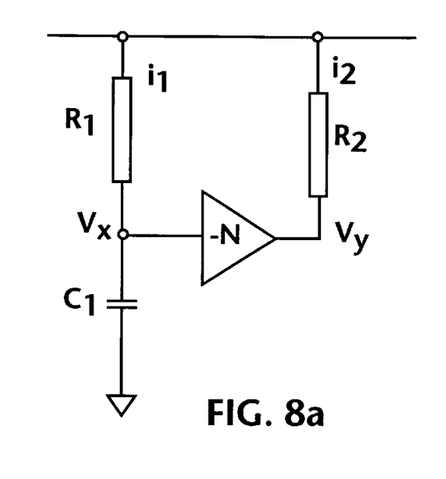
FIG. 8a is a schematic view of an inductance emulator circuit.
Figure 8B:
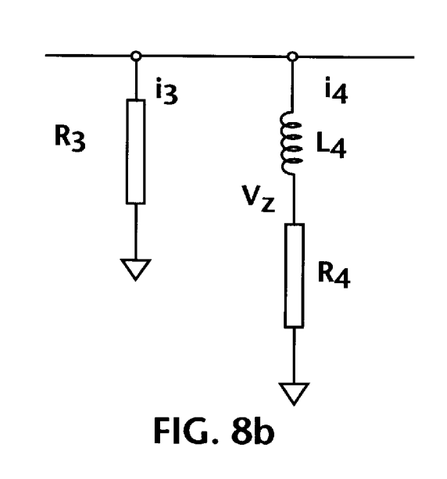

With regard to FIG. 8a, the invention also encompasses the emulation of an inductive impedance. Resistor $R_1$ and capacitor $C_1$ form a voltage divider between the supply voltage and ground, defining a midpoint node voltage $V_x$. An amplifier is connected between the midpoint node and a resistor $R_2$, which in turn is connected to the supply voltage. The amplifier has a negative gain of $-N$, and the output of the amplifier at the node connection with $R_2$ is $V_y$. The inductor emulation circuit of FIG. 8a is equivalent to an inductor circuit as shown in FIG. 8b. The following formulae indicate the relationship between $R_1$, $R_2$, amplifier gain ($-N$), and C1 to the component values $R_3$, $R_4$, $L_4$ of FIG. 8b:

$$R_3 = \frac{R_1 * R_2}{R_1 + R_2}$$

$$R_4 = \frac{1}{N/R_2 - 1/R_1}$$

$$L_4 = C_1 * R_1 * R_4$$

Figure 9A:
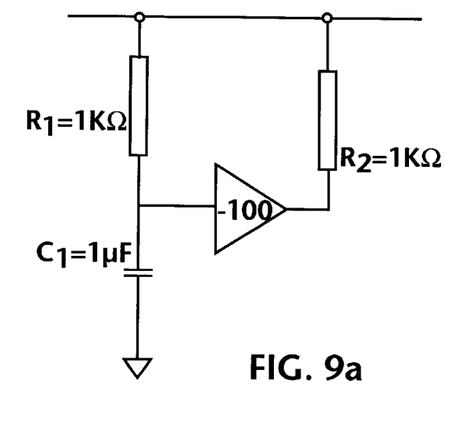
FIGS. 9a and 9b are schematic views of circuits corresponding to FIGS. 8a and 8b with real component values.
Figure 9B:
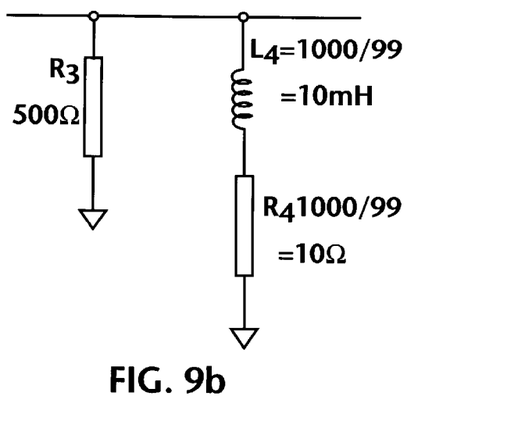

A practical example of the inductor emulator circuit of FIG. 8a, using real component values, is shown in FIG. 9a, and the equivalent inductive network is shown in FIG. 9b. Given that:

$R_1 = R_2 = 1 K\Omega$ $C_1 = 1 \mu F = 10^{-6} F$ $N = -100$

Figure 11:
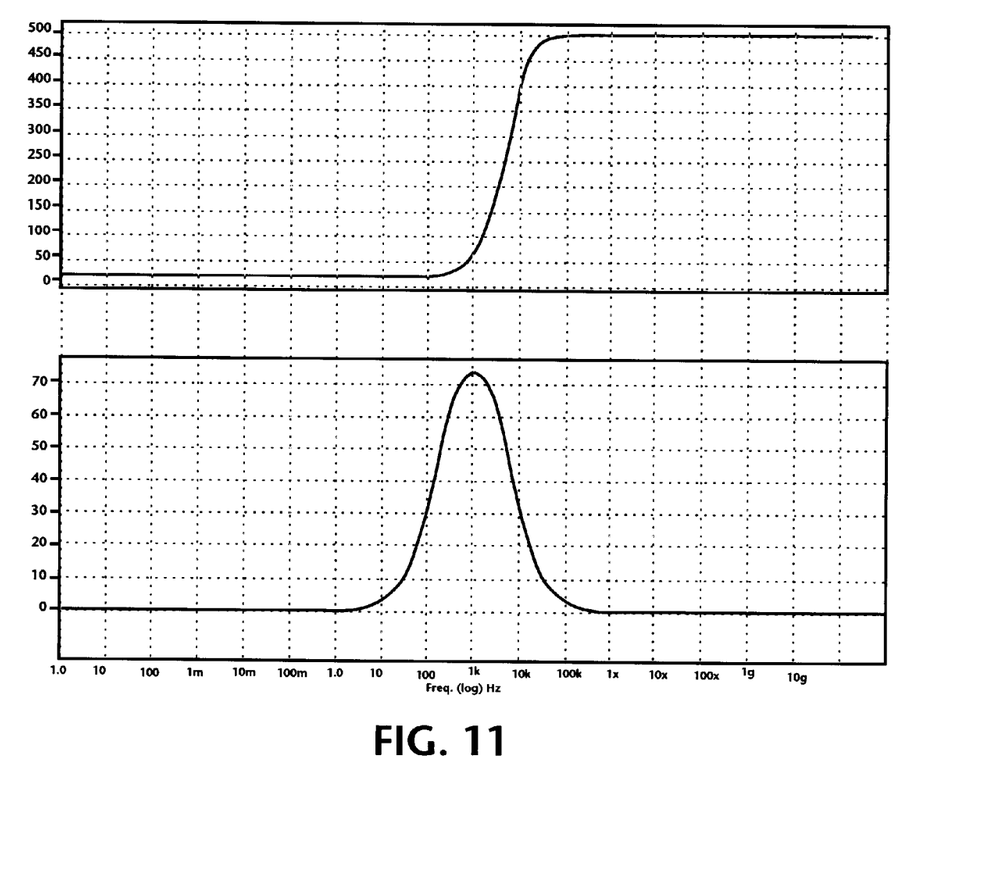
FIG. 11 is a Bode plot of the impedance magnitude (top) and phase (bottom) of the two equivalent circuits in FIG. 9a–9b and FIGS. 10a–10b.

The resulting equivalent inductor circuit of FIG. 9b has the following values:

$R_3 = 500 \Omega$ $R_4 = 1000/99 \approx 10 \Omega$ $L_4 = 1/99 H \approx 10 mH$ Thus an inductor of approximately 10 mH is emulated using only capacitive and resistive impedance and an amplifier, all of which may be integrated in a silicon die. The Bode plot of FIG. 11 illustrates the magnitude of the impedance and phase of the two equivalent circuits of FIG. 9a and 9b.

Figure 10A:
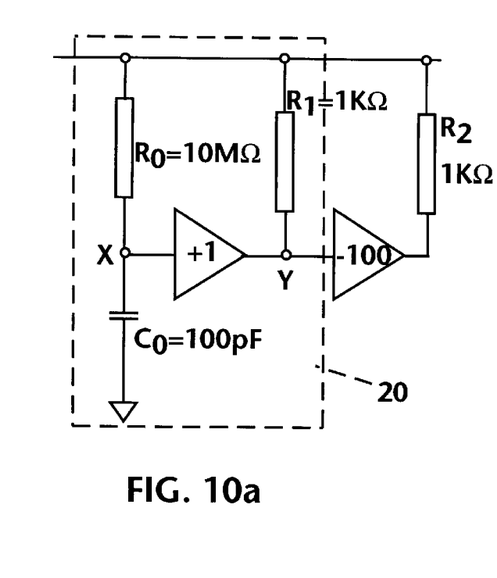
FIGS. 10a–10b are schematic views of impedance emulator circuits with real component values, and the resulting equivalent circuit.
Figure 10B:
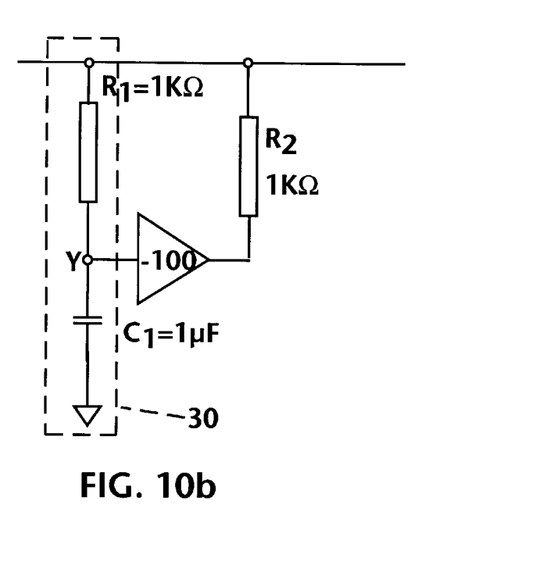

It is apparent that a capacitor of such large value as 1 $\mu F$ would occupy an impractically large area on a silicon die. However, the emulation concept of the present invention may be compounded to achieve the equivalent circuit of FIG. 9b. With reference to FIG. 10a, the components within the box 20 comprise an impedance emulator, similar to the emulator of FIG. 6c, that replicates an impedance of 1 $\mu F$ in series with a resistor of 1K$\Omega$ at node Y, as shown in FIG. 10b. In FIG. 10b $C_1 = 1 \mu F$ (same value as in FIG. 9a). Node Y, in turn, may be connected in the impedance emulator of FIG. 10b, which is similar to the replicator of FIG. 9a, resulting in a circuit equivalent to the circuit shown in FIG. 9b. Note emulator circuit 20 of FIG. 10a has been replaced by equivalent circuit 30 in FIG. 10b. Thus a large inductor may be emulated using components easily formed in silicon and occupying a small die area. Other combinations of impedance emulators disclosed herein may be made to achieve similar results. Note also that in FIG. 10a the input of the (-100) amplifier can be connected to either circuit node X or circuit node Y.

In general, the $V_x$ voltage source is not limited to a voltage divider, and may be provided by any suitable voltage source that is adapted to generate a similar impedance characteristic.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. A impedance emulating device, including:
   a voltage divider having a midpoint node at voltage $V_X$;
      said voltage divider including at least one impedance having a reactive component;
   an OP AMP having one input connected to $V_X$ and the other input connected to the output of said OP AMP, whereby said output of said OP AMP is driven to equal $V_X$;
   a load impedance connected at one end to said OP AMP output;
      said voltage divider and said load impedance having values scaled so that $V_X$ replicates the output of an emulated impedance of predetermined reactance and magnitude.

2. The impedance emulating device of claim 1, wherein said OP AMP has a gain of +1.

3. The impedance emulating device of claim 1, wherein said voltage divider is connected between a voltage supply and ground, and said load impedance is connected between said output of said OP AMP and said voltage supply.

4. The impedance emulating device of claim 1, wherein said voltage divider is connected between a voltage supply and ground, and said load impedance is connected between said output of said OP AMP and said ground.

5. A impedance emulating device, including:
   a voltage divider having a midpoint node at voltage $V_X$;
   an OP AMP having one input connected to $V_X$ and an output connected to the gate of a transistor, the other input of said OP AMP connected to the source/drain circuit of said transistor, whereby said output of said OP AMP is driven to equal $V_X$;
   a load impedance connected at one end to said other input of said OP AMP and said source/drain circuit of said transistor, whereby said source/drain circuit provides a current path to said load impedance;
   said voltage divider and said load impedance having values scaled so that $V_X$ replicates the output of an emulated impedance of predetermined reactance to and magnitude.

6. The impedance emulating device of claim 5, wherein said OP AMP has a gain of +1.

7. The impedance emulating device of claim 5, wherein said voltage divider is connected between a voltage supply and ground, and said load impedance is connected between said source/drain circuit of said transistor and said voltage supply.

8. The impedance emulating device of claim 5, wherein said voltage divider is connected between a voltage supply and ground, and said load impedance is connected between said source/drain circuit of said transistor and said ground.

9. The impedance emulating device of claim 5, wherein said voltage divider includes impedances $KZ_a$ and $KZ_b$ connected in series, and said load impedance includes an impedance $KZ_a/K-1$, K being a numerical constant.

10. The impedance emulating device of claim 5, wherein said voltage divider includes impedances $KZ_a$ and $KZ_b$ connected in series, and said load impedance includes an impedance $KZ_b/K-1$, K being a numerical constant.

11. The impedance emulating device of claim 5, wherein said voltage divider includes impedances $KZ_a/K-1$ and $KZ_b/K-1$ connected in series, and said load impedance includes an impedance $KZ_a$, K being a numerical constant.

12. The impedance emulating device of claim 5, wherein said voltage divider includes impedances $KZ_a/K-1$ and $KZ_b/K-1$ connected in series, and said load impedance includes an impedance $KZ_b$, K being a numerical constant.

13. The impedance emulating device of claim 5, wherein the positive input of said OP AMP is connected to $V_X$ and the negative input of said OP AMP is connected to said source/drain circuit of said transistor.

14. A impedance emulating device, including:
a voltage divider connected between a voltage supply and ground and having a midpoint node at voltage $V_X$;
an amplifier having an input connected to $V_X$ and an output $V_y$;
a load impedance connected between $V_y$ and said voltage supply;
said voltage divider and said load impedance having values scaled so that $V_Y$ replicates the output of an emulated impedance of predetermined reactance and magnitude.

15. The impedance emulating device of claim 14, wherein said amplifier has a negative gain.

16. An impedance emulating device, including:
a voltage divider having a midpoint node at voltage $V_X$;
an OP AMP having one input connected to $V_X$ and the other input connected to the output of said OP AMP, whereby said output of said OP AMP is driven to equal $V_X$;
a load impedance connected at one end to said OP AMP output;
said voltage divider and said load impedance heaving values scaled so that $V_X$ replicates the output of an emulated impedance of predetermined reactance and magnitude;
said voltage divider including impedances $KZ_a$ and $KZ_b$ connected in series, and said load impedance including an impedance $KZ_a/K-1$, K being a numerical constant.

17. An impedance emulating device, including:
a voltage divider having a midpoint node at voltage $V_X$;
an OP AMP having one input connected to $V_X$ and the other input connected to the output of said OP AMP, whereby said output of said OP AMP is driven to equal $V_X$;
a load impedance connected at one end to said OP AMP output;
said voltage divider and said load impedance having values scaled so that $V_X$ replicates the output of an emulated impedance of predetermined reactance and magnitude;
said voltage divider including impedances $KZ_a$ and $KZ_b$ connected in series, and said load impedance including an impedance $KZ_b/K-1$, K being a numerical constant.

18. An impedance emulating device, including:
a voltage divider having a midpoint node at voltage $V_X$;
an OP AMP having one input connected to $V_X$ and the other input connected to the output of said OP AMP, whereby said output of said OP AMP is driven to equal $V_X$;
a load impedance connected at one end to said OP AMP output;
said voltage divider and said load impedance having values scaled so that $V_X$ replicates the output of an emulated impedance of predetermined reactance and magnitude;
said voltage divider including, impedances $KZ_a/K-1$ and $KZ_b/K-1$ connected in series, and said load impedance including an impedance $KZ_a$, K being a numerical constant.

19. An impedance emulating device, including:
a voltage divider having a midpoint node at voltage $V_X$;
an OP AMP having one input connected to $V_X$ and the other input connected to the output of said OP AMP, whereby said output of said OP AMP is driven to equal $V_X$;
a load impedance connected at one end to said OP AMP output;
said voltage divider and said load impedance having values scaled so that $V_X$ replicates the output of an emulated impedance of predetermined reactance and magnitude;
said voltage divider including impedances $KZ_a/K-1$ and $KZ_b/K-1$ connected in series, and said load impedance including an impedance $KZ_b$, K being a numerical constant.

20. An impedance emulating device, including:
a voltage divider having a midpoint node at voltage $V_X$;
an OP AMP having one input connected to $V_X$ and the other input connected to the output of said OP AMP, whereby said output of said OP AMP is driven to equal $V_X$;
a load impedance connected at one end to said OP AMP output;
said voltage divider and said load impedance having values scaled so that $V_X$ replicates the output of an emulated impedance of predetermined reactance and magnitude;
the positive input of said OP AMP being, connected to $V_X$ and the negative input of said OP AMP being connected to the output of said OP AMP.

21. A impedance emulating device, including:
a voltage divider connected between a voltage Supply and ground and having a midpoint node at voltage $V_X$;
an amplifier having an input connected to $V_X$ and an output $V_Y$;
a load impedance connected between $V_Y$ and said voltage supply;
said voltage divider and said load impedance having values scaled so that $V_Y$ replicates the output of an emulated impedance of predetermined reactance and magnitude;
said voltage divider includes impedances $R_1$ and $C_1$ connected in series between said voltage supply and ground, said amplifier has a gain of $-N$, and said emulated impedance has a resistance value $R_4$:

$$R_4 = \frac{1}{N/R_2 - 1/R_1}$$

22. The impedance emulating device of claim 21, wherein said emulated impedance has an inductance value $L_4$:

$$L_4 = C_1 * R_1 * R_4.$$

23. The impedance emulating device of claim 21, further including a further impedance emulating device for creating said impedance $C_1$.

24. In an integrated circuit construction, a method for emulating a large reactive impedance, comprising the steps of:

providing a voltage divider comprised of at least one impedance having a relative component, said voltage divider having a midpoint node at voltage $V_X$;

connecting one input of an OP AMP to $V_X$ and the other input connected to the output of said OP AMP, whereby said output of said OP AMP is driven to equal $V_X$;

connecting a load impedance at one end to said OP AMP output;

said voltage divider and said load impedance having values scaled so that $V_X$ replicates the output of an emulated impedance of predetermined reactance and magnitude.

25. The method of claim 24, wherein said emulated impedance includes an inductive component.

* * * * *